United States Patent [19]

Kochi

[11] Patent Number: 5,841,685
[45] Date of Patent: *Nov. 24, 1998

[54] SEMICONDUCTOR DEVICE, AND OPERATING DEVICE, SIGNAL CONVERTER, AND SIGNAL PROCESSING SYSTEM USING THE SEMICONDUCTOR DEVICE

[75] Inventor: Tetsunobu Kochi, Hiratsuka, Japan

[73] Assignee: Canon Kabushiki Kaisha, Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 548,410

[22] Filed: Oct. 26, 1995

[30] Foreign Application Priority Data

Oct. 28, 1994 [JP] Japan ................................. 6-265040

[51] Int. Cl.$^6$ ........................................ G06G 7/00
[52] U.S. Cl. ........................................ 364/807
[58] Field of Search ........................ 364/825, 807, 364/607, 606

[56] References Cited

U.S. PATENT DOCUMENTS

| | | |
|---|---|---|
| 3,484,589 | 12/1969 | Jernakoff .................. 364/606 |
| 4,524,425 | 6/1985 | Bertails ...................... 364/825 |
| 4,654,815 | 3/1987 | Marin et al. ............... 364/606 |
| 4,849,662 | 7/1989 | Holberg et al. ........... 364/825 |
| 5,428,237 | 6/1995 | Yuzurihara et al. ...... 257/349 |
| 5,466,961 | 11/1995 | Kikuchi et al. ........... 257/379 |

FOREIGN PATENT DOCUMENTS

| | | |
|---|---|---|
| 569856A2 | 11/1993 | European Pat. Off. . |
| 2536922 | 6/1984 | France . |
| 2599526 | 12/1987 | France . |
| 4402952 | 6/1994 | Germany . |

OTHER PUBLICATIONS

"An Economical Majority Logic IC Materialized by the CMOS", Nikkei Electronics, Nov. 5, 1973, pp. 132–144.

*Primary Examiner*—Tan V. Mai
*Attorney, Agent, or Firm*—Fitzpatrick, Cella, Harper & Scinto

[57] ABSTRACT

In a semiconductor device in which one terminal of each of several capacitors is connected to a corresponding one of multiple input terminals via a switch and the remaining terminals of the capacitors are commonly connected to a sense amplifier, the output from the sense amplifier is connected to at least one of the multiple input terminals, thereby reducing the circuit scale, improving the operation speed, and saving power.

17 Claims, 11 Drawing Sheets

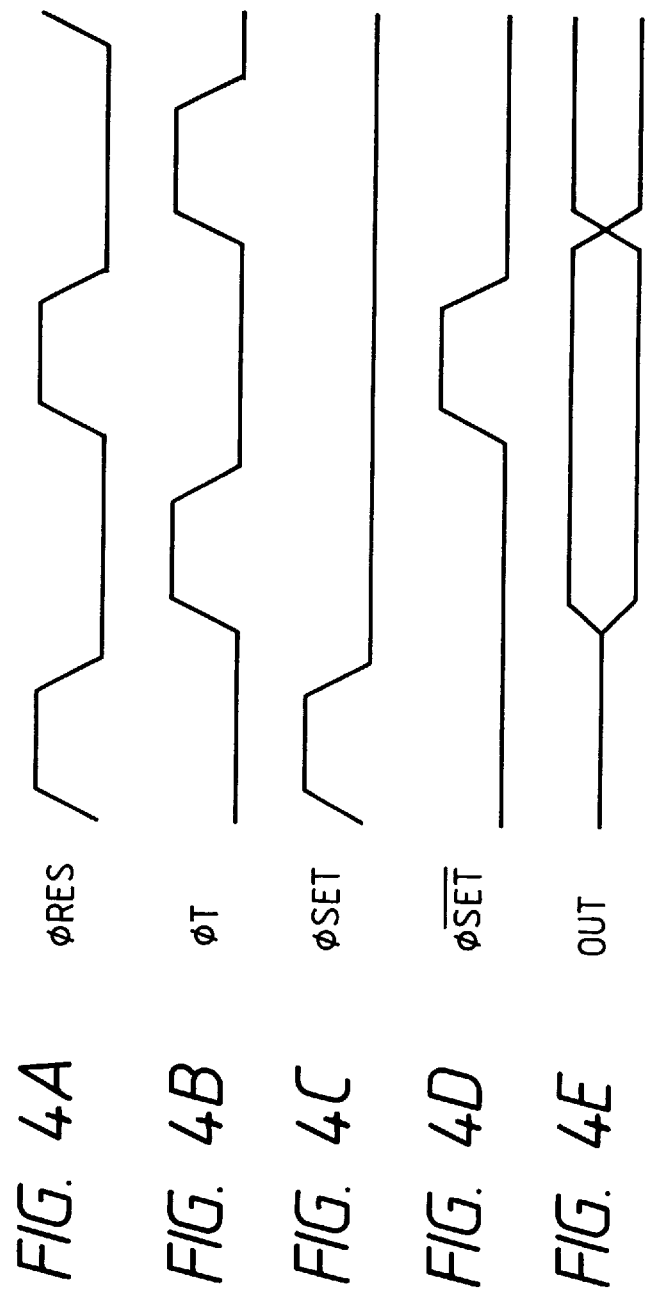

SEMICONDUCTOR DEVICE, AND OPERATING DEVICE, SIGNAL CONVERTER, AND SIGNAL PROCESSING SYSTEM USING THE SEMICONDUCTOR DEVICE

BACKGROUND OF THE INVENTION

1. Field of the Invention

The present invention relates to a semiconductor device, and an operating device, a signal converter, and a signal processing system using the semiconductor device and, more particularly, to a semiconductor device which can perform parallel arithmetic operations, and an operating device which can perform, e.g., a correlation arithmetic operation, a signal converter for A/D (analog-to-digital) or D/A (digital-to-analog) converting a signal, and a signal processing system using the semiconductor device.

2. Related Background Art

In a conventional semiconductor device that performs parallel arithmetic operation processing, since the circuit scale increases in progression as the number of signals to be subjected to parallel arithmetic operations increases, the manufacturing cost increases, and the yield is lowered. Due to an increase in delays in, e.g., wiring lines or due to an increase in the number of times of arithmetic operations must be performed in the circuit upon an increase in circuit scale, the operation speed decreases and the consumption of power increases considerably.

For example, in the case of a solid-state image pickup device shown in FIG. 1, time-series analog signals output from a sensing unit 60, in which image pickup elements 41 are arranged two-dimensionally, and which serves as an area sensor, are converted into digital signals by an A/D converter 40, and are temporarily stored in a frame memory 39. These signals are processed by an arithmetic operation circuit 38, and the processed signals are output from an arithmetic operation output circuit 50. More specifically, by executing a correlation arithmetic operation between data obtained at different times, the moving amount (amount of movement ($\Delta X$, $\Delta Y$) of an object or the like can be output.

However, in order to perform real-time processing of a dynamic image, the number of processing steps in the arithmetic operation processing is very large, and in order to obtain images with higher reality, the circuit scale increases in progression, resulting in a low processing speed. For example, a demand has arisen for an apparatus which can process an MPEG2 method proposed as a dynamic image expansion/compression method at a practical speed. This process the problem of a decrease in operation speed and the problem of an increase in consumption power upon an increase in circuit scale, as well as the problem of an increase in manufacturing cost and the problem of a decrease in manufacturing yield upon an increase in circuit scale are posed.

Furthermore, a majority logic circuit effective for the arithmetic operation processing circuit is disclosed in Nikkei Electronics "Economical Majority Logic IC Realized by CMOS", 1973, 11. 5. pp. 132–144, a digital signal processing method. This reference describes a circuit based on a CMOS technique. In this case as well, since the number of elements based on the CMOS technique increases, and the number of stages in the arithmetic operation processing increases, the problems of an increase in circuit scale, an increase in consumption power, and a decrease in operation speed are, similarly, not avoided.

SUMMARY OF THE INVENTION

The present invention has been made in consideration of the above-mentioned problems, and has as its object to provide a semiconductor device which can reduce the circuit scale, increase the operation speed, and save power.

It is another object of the present invention to provide a semiconductor device which has a small chip size and low cost, and can improve the yield.

It is still another object of the present invention to provide a semiconductor device which comprises a plurality of input terminals, a plurality of capacitors, one terminal of each of which is electrically connected to the corresponding input terminal via a switch, and a sense amplifier which is commonly connected to the remaining terminals of the capacitors, and in which the output from the sense amplifier is connected to at least one of the input terminals.

BRIEF DESCRIPTION OF THE DRAWINGS

FIGS. 4A to 4E and FIGS. 7A to 7H are operation timing charts for explaining examples of the operation timings of the present invention;

DETAILED DESCRIPTION OF THE PREFERRED EMBODIMENTS

The above-mentioned problems can be solved by a semiconductor device which comprises a plurality of input terminals, a plurality of capacitors, one terminal of each of which is electrically connected to the corresponding input terminal via a switch, and a sense amplifier which is commonly connected to the remaining terminals of the capacitors, and in which the output from the sense amplifier is connected to at least one of the input terminals. With this arrangement, effects such as small circuit scale, high operation speed, and low consumption of power can be obtained.

In the present invention, the output from the sense amplifier may be connected to at least one of the multiple input terminals via latch means.

In the present invention, a plurality of semiconductor devices as described above may be arranged, and the output from the first semiconductor device of the plurality of semiconductor devices and/or the inverted output of the output from the semiconductor device may be input to the second semiconductor device.

In the present invention, when the minimum one of the capacitors corresponding to the input terminals is represented by C, the total of the capacitance values of the commonly connected capacitor preferably becomes exactly or substantially an odd multiple value of the minimum capacitor C.

The present invention can be applied to an operating device which can perform a correlation arithmetic operation using the semiconductor device of the present invention.

The present invention can be applied to a signal converter such as an A/D converter which includes the semiconductor device of the present invention, receives an analog signal by the semiconductor device, and outputs a digital signal corresponding to the analog signal, or a D/A converter which includes the semiconductor device of the present invention, receives a digital signal by the semiconductor device, and outputs an analog signal corresponding to the digital signal.

Furthermore, the present invention can be applied to a signal processing system including at least one of the operating device and the signal converter. This signal processing system can include an image input device for inputting an image signal or a storage device for storing information.

The preferred embodiments of the present invention will be described in detail below with reference to the accompanying drawings as needed.

[First Embodiment]

Figure 1:
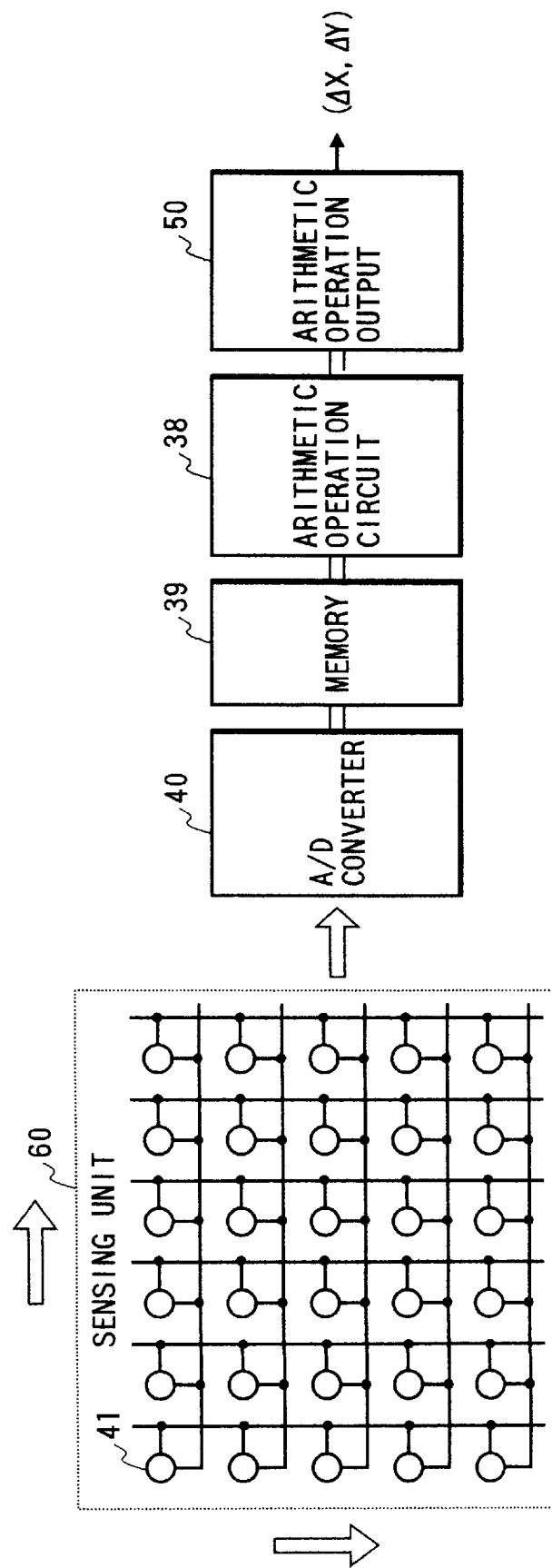
FIG. 1 is a schematic block diagram for explaining the arrangement of a solid-state image pickup device.
Figure 2:
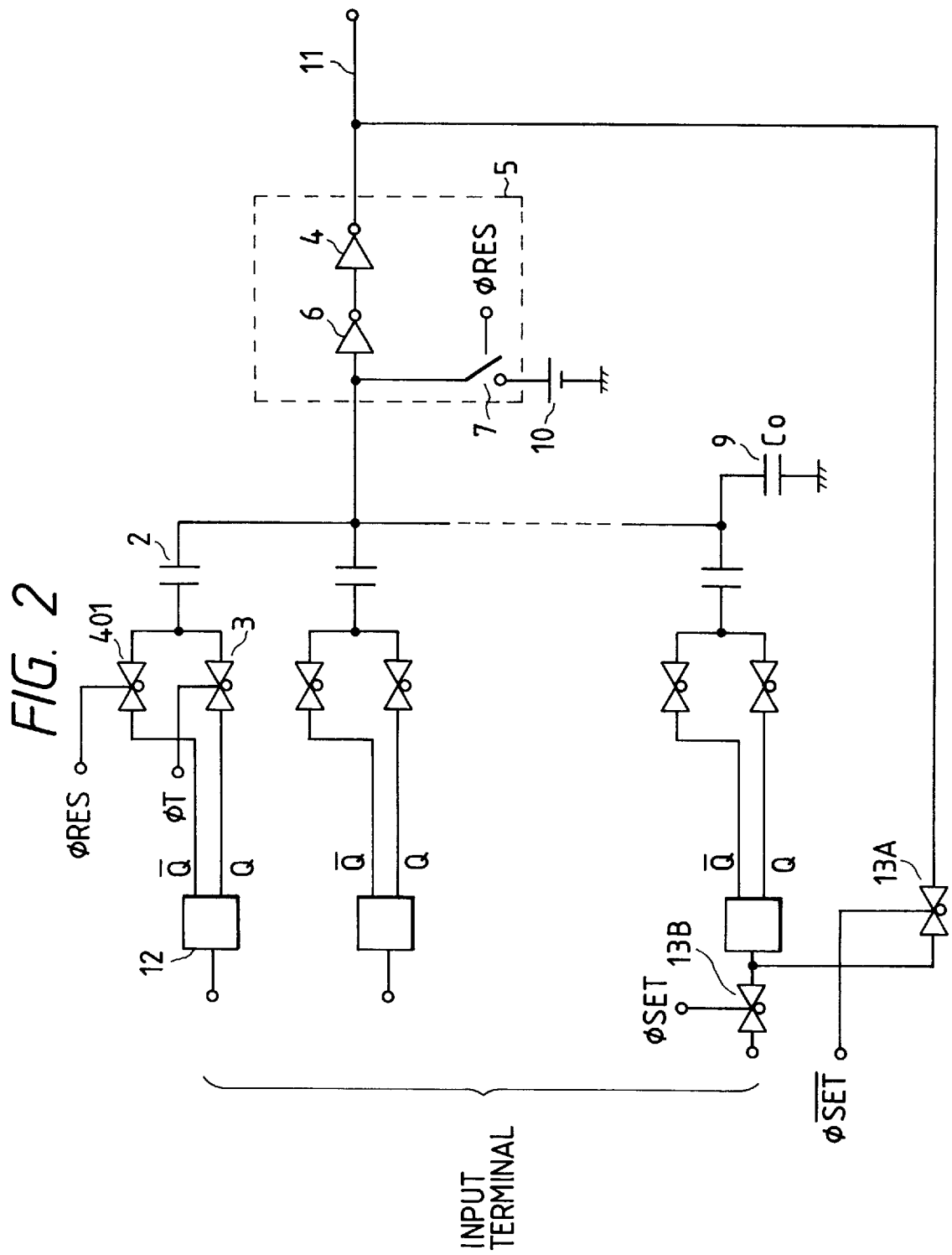
FIGS. 2, 6, and 8 are schematic equivalent circuit diagrams for explaining examples of a semiconductor device according to the present invention.

FIG. 2 is a schematic equivalent circuit diagram for explaining the first embodiment of a semiconductor device of the present invention. Referring to FIG. 2, the semiconductor device includes a reset switch, capacitors 2, signal transfer switches 3, a sense amplifier 5, an inverter 6 in the sense amplifier 5, a second inverter 4 in the sense amplifier 5, a second reset switch 7 for resetting the input terminal of the inverter 6, a reset power supply (not shown), a second reset power supply 10, an output terminal 11, and a parasitic capacitance 9 connected to the commonly connected terminals of the capacitors 2. However, the present invention is not limited to this parasitic capacitance 9. Second reset switches 401 of the respective input terminals operate at the same time in response to a reset pulse φRES. The device also includes latch circuits 12. The output from the sense amplifier 5 is connected to one of the input terminals via a selection switch 13A. Although not shown, a transfer pulse φT and the reset pulse φRES are respectively input to the signal transfer switches 3 and the second transfer switches 401. That is, FIG. 2 illustrates only that uppermost set receives these pulses, but the pulses are similarly input to other sets.

Figure 3A:
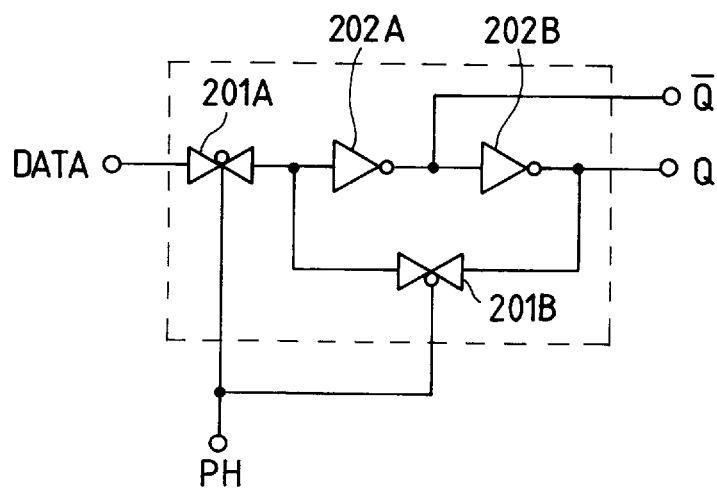
FIGS. 3A and 3B are respectively schematic equivalent circuit diagrams for explaining examples of a latch circuit which can be applied to the present invention.
Figure 3B:
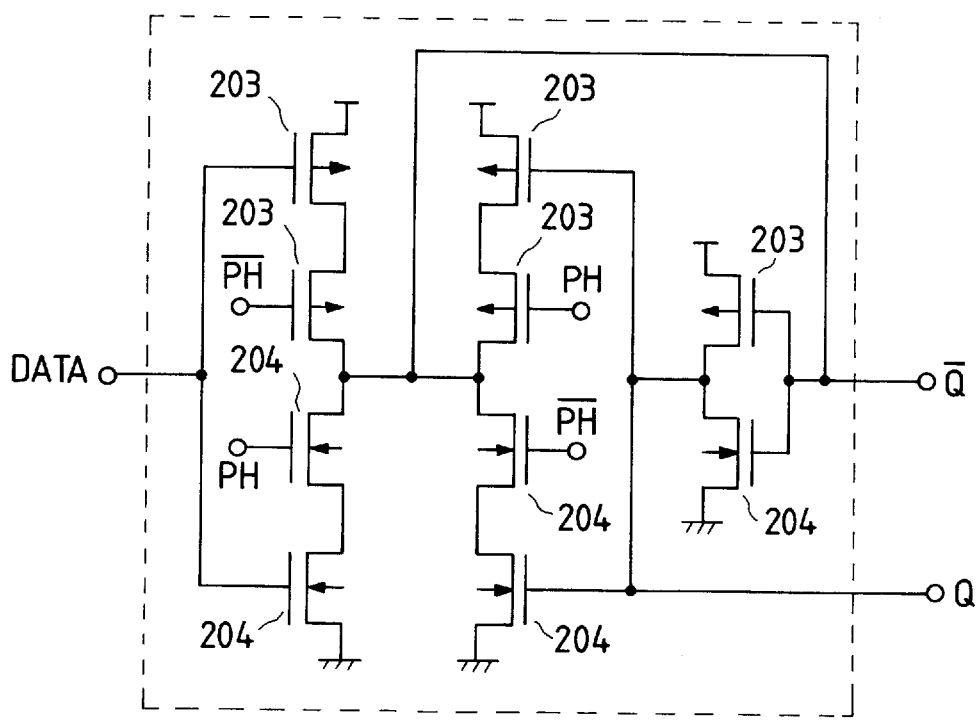

FIGS. 3A and 3B are schematic equivalent circuit diagrams for explaining preferred examples of the latch circuit 12. Referring to FIG. 3A, the latch circuit includes transfer switches 201A and 201B and inverters 202A and 202B. When the transfer switch 201A is enabled by a signal PH, a signal DATA is transferred to the input terminal of the inverter 202A. When the transfer switch 201A is disabled by the signal PH, the switch 201B is enabled at the same time, and keeps latching the signal DATA until the transfer switch 201A is enabled at the next timing. A non-inverted output is obtained from the inverter 202B, and an inverted output is obtained from the inverter 202A.

FIG. 3B shows another example of the latch circuit 12. Referring to FIG. 3B, the latch circuit includes PMOS transistors 203 and NMOS transistors 204. In this circuit, as in FIG. 3A, the signal DATA is transferred in response to the signal PH, and the value is latched until the next application timing of the signal PH. In both the circuits shown in FIGS. 3A and 3B, a binary signal is latched using the inverter. However, the present invention is not limited to this. For example, the present invention may be applied to a circuit which latches an analog signal by adding a sample-hold circuit to the input of an amplifier circuit.

FIGS. 4A to 4E are timing charts showing the operation timings of this embodiment. The operation of this embodiment will be described below with reference to FIGS. 4A to 4E. An input signal is latched by each latch circuit 12. At this time, a switch 13B is enabled by a pulse φSET, and a signal is externally input to the lowermost input terminal in FIG. 2. Then, one terminal of each capacitor 2 is reset by an inverted signal of the input signal in response to the reset pulse φRES. The reset voltage is not limited to this, but another voltage may be used. Alternatively, a plurality of voltages may be used. At substantially the same time, the input terminal of the inverter 6 in the sense amplifier 5 is reset by enabling the reset switch 7. In this case, the reset voltage is selected to be a value near the logic inversion voltage at which the output from the inverter 6 is inverted. When the reset pulse φRES is turned off, the two ends of each capacitor 2 are held at the corresponding reset potentials.

When each transfer switch 3 is enabled by the transfer pulse φT, the signal is transferred from the latch circuit 12 to one terminal of the capacitor 2, and the potential at one terminal of the capacitor changes from the reset voltage (e.g., 5 V–VX) to VX. For example, let C be the capacitance of the capacitor 2, and $C_0$ be the value of the parasitic capacitance. When N capacitors 2 are connected in parallel with each other, the potential at the commonly connected terminals of the capacitors 2 changes for a single input by capacitance division from the reset potential of the inverter 6 by:

$$|C \times (2.5 - VX)/(NC + C_o)| \qquad (1)$$

When the input terminal voltage of the inverter 6 changes from a voltage near the logic inversion voltage, the output terminal voltage of the inverter 6 is inverted accordingly. When signals are input to the N inputs, a sum of N capacitance division outputs is input to the input terminal of the inverter 6. If the sum of the N inputs assumes a positive value, the input terminal of the inverter 6 shifts to a potential higher than the logic inversion voltage, and a high-level signal is output to the output terminal 11 of the sense amplifier 5. On the other hand, if the sum assumes a negative value, the input terminal of the inverter 6 shifts to a potential lower than the logic inversion voltage, and a low-level signal is output.

In this embodiment, respective input signals are weighted in correspondence with processing to be executed on the basis of the amplitudes of input signals and the capacitances of the capacitors 2 which receive the signals, and these signals are simultaneously subjected to a parallel arithmetic operation in the sense amplifier 5. Then, when the selection switch 13A is enabled by a pulse φ$\overline{\text{SET}}$, the previous arithmetic operation result is input to the lowermost input terminal as one of input signals. Subsequently, when the arithmetic operations are similarly performed, a single parallel arithmetic operation circuit block according to the present invention can realize complicated arithmetic operations, and consequently, a great reduction of the circuit scale and improvement of manufacturing yield can be attained as compared to a conventional parallel arithmetic operation circuit. Upon reduction of the circuit scale, the consumption power can be saved, needless to say. Furthermore, in this embodiment, the output is directly connected to its own input. However, the present invention is not limited to this. For example, a signal may be inverted, added with a gain, or connected via a circuit block (to be described later) to constitute a desired arithmetic operation logic.

[Second Embodiment]

Figure 5:
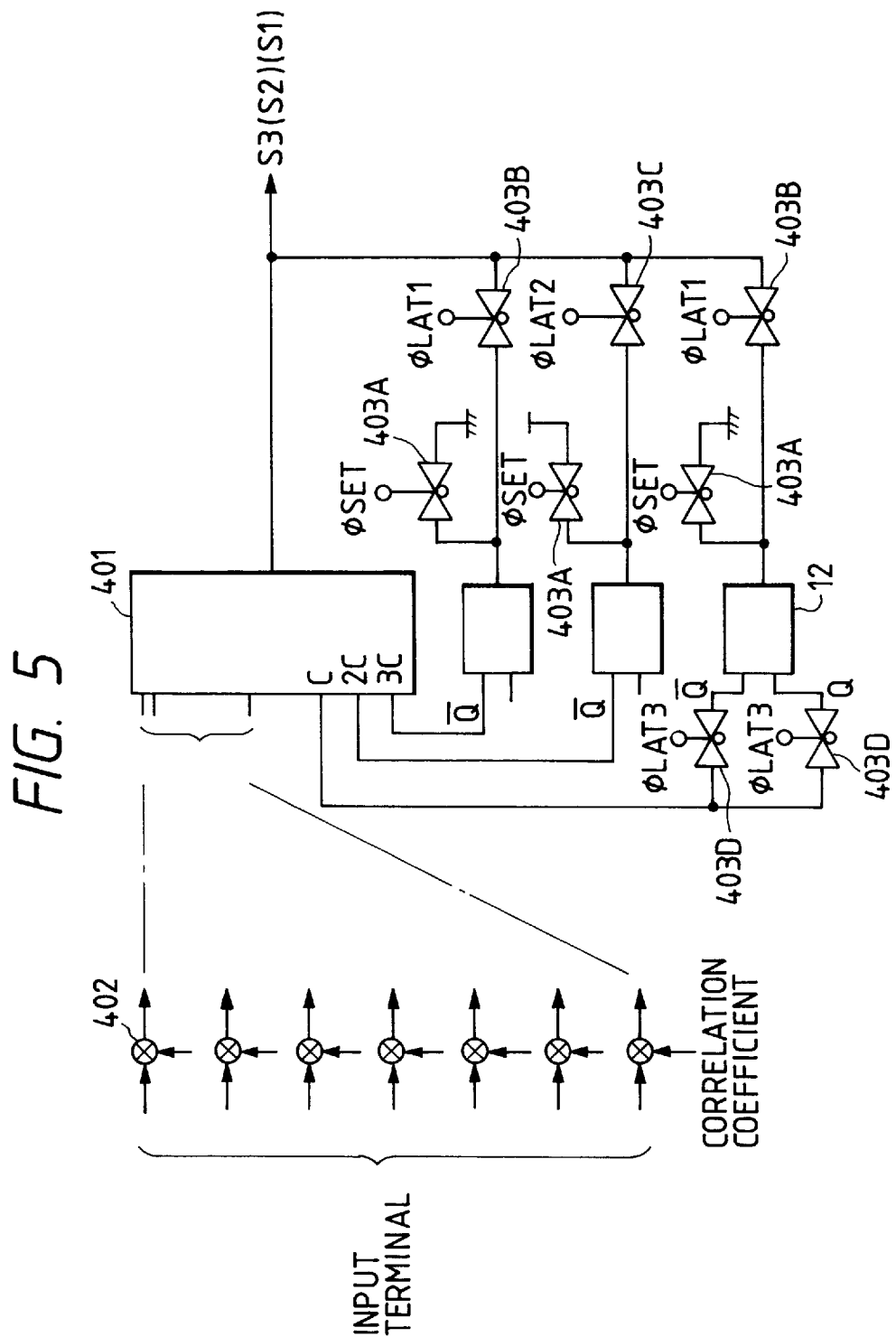
FIG. 5 is a schematic equivalent circuit diagram for explaining an example of an operating device according to the present invention.
Figure 6:
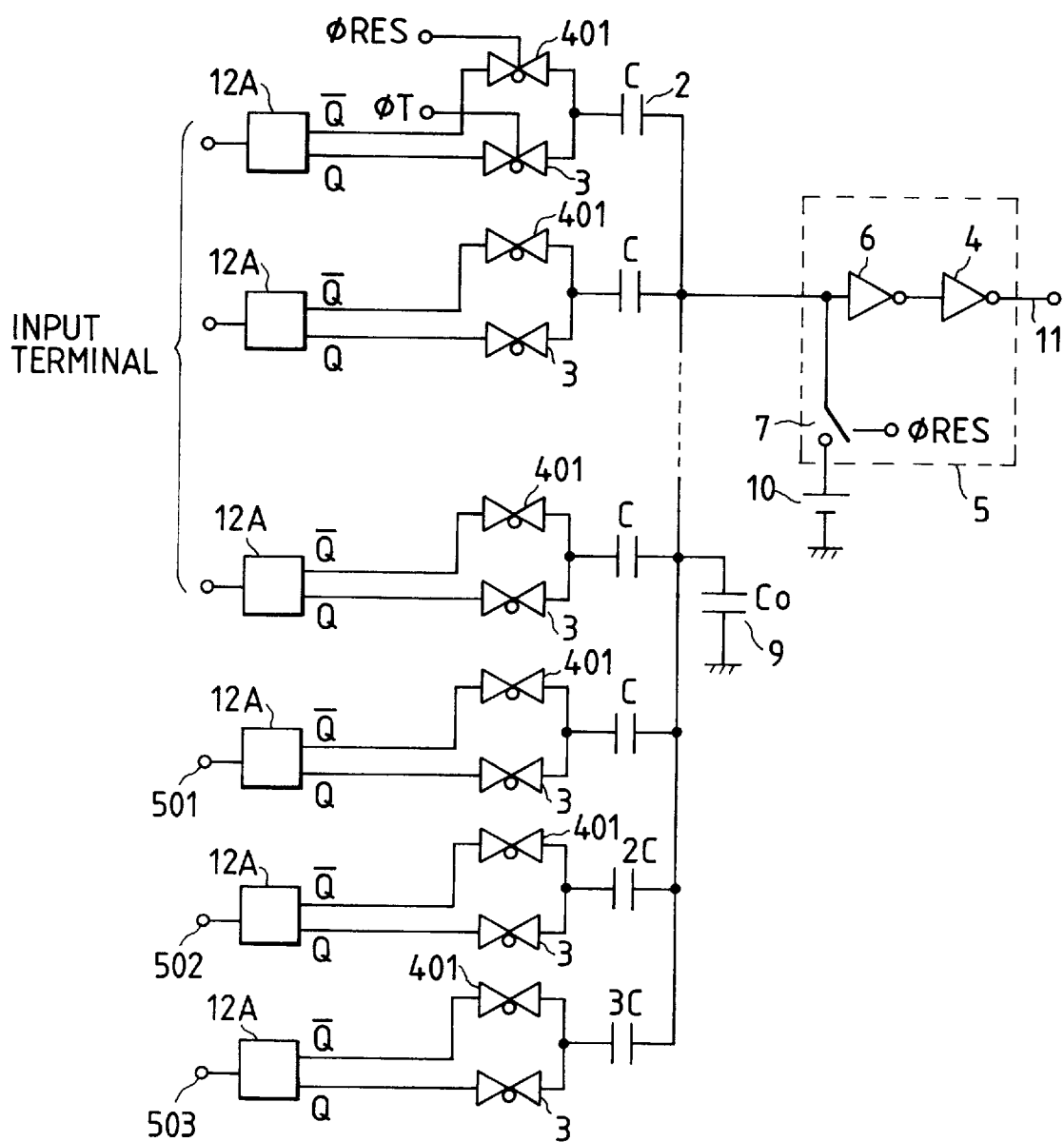
Figure 7:
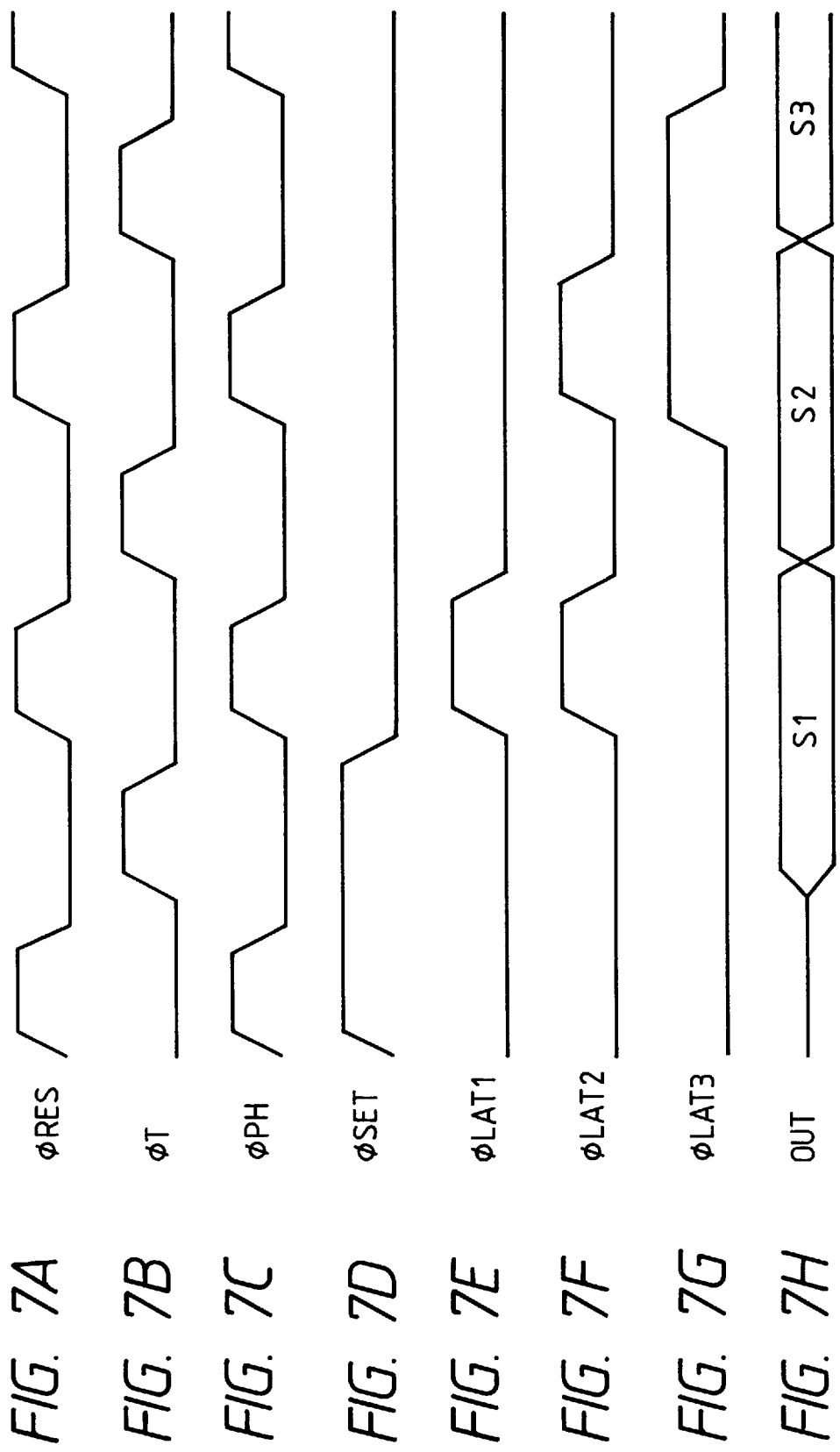

FIG. 5 is a schematic circuit diagram for explaining an embodiment in which the present invention is applied to a correlation operating circuit. Referring to FIG. 5, the circuit includes a parallel arithmetic operation circuit block 401, comparators 402, and latch circuits 12. FIG. 6 is a circuit diagram of the parallel arithmetic operation circuit block 401. Referring to FIG. 6, the block includes first, second, and third weighted input terminals 501, 502, and 503. These terminals are connected to capacitors having capacitance values about one time, twice, and three times as large as those of capacitors 2 connected to other input terminal routes. FIGS. 7A to 7H are operation timing charts of this embodiment. The parallel arithmetic operation circuit block 401 operates in response to pulses φRES2 and φT2, and the latch circuits 12 operate in response to a pulse φPH.

The basic operation will be described below with reference to FIG. 6. As in the first embodiment, an input signal is latched by each latch circuit 12A. At this time, in response to a pulse φSET, the weighted input terminals 501 and 502 are supplied with a voltage of 0 V corresponding to low level, and the weighted input terminal 503 is applied with a voltage of 5 V corresponding to high level. Then, the voltages at the two terminals of each capacitor 2 are reset to the corresponding reset voltages in response to a reset pulse φRES. When each transfer switch 3 is enabled by a transfer pulse T, a signal is transferred to one terminal of the corresponding capacitor 2, and the potential at one terminal of the capacitor 2 changes to low or high level. The commonly connected terminal of each capacitor 2 changes for a corresponding input by capacitance division. When the input terminal voltage of the inverter 6 changes from the logic inversion voltage, the output terminal voltage of the inverter 6 is inverted accordingly. When signals are input to the N inputs, a sum of N capacitance division outputs is input to the input terminal of the inverter 6.

Although not shown, in FIG. 6 as well, the transfer pulse φT and the reset pulse φRES are input to all the sets of the transfer switches 3 and the second transfer switches 401.

In this embodiment, since signals having opposite polarities are applied to the weighted input terminal 503 with the x3 capacitance value, and the weighted input terminals 501 and 502 having x1 and x2 capacitance values, the voltage change amounts at the commonly connected terminals of the capacitors 2 cancel each other. Since the capacitors 2 provided to the input terminals other than the weighted input terminals have substantially the same capacitance values, if the number of high-level signals of N inputs is a majority, the input terminal of the inverter 6 shifts to a potential higher than the logic inversion voltage, and a high-level signal is output to the output terminal 11 of the sense amplifier 5. On the other hand, if the number of low-level signals is a majority, a low-level signal is output.

With the above arrangement, the circuit shown in FIG. 6 serves as a majority arithmetic operation circuit for outputting a logic value corresponding to the majority of a plurality of inputs. A 7-input correlation operating circuit will be described below with reference to FIG. 5. Referring to FIG. 5, signals are input to the comparators 402 together with correlation coefficients. The majority arithmetic operation circuit block 401 can be considered as a 13-input or equivalent majority arithmetic operation circuit. That is, if the unit capacitance value connected to the input terminal route is represented by C, 13 capacitors corresponding to C are commonly connected, a high-level signal is applied from the weighted input terminal to three capacitors corresponding to the unit capacitance C (the 3C capacitor in FIG. 6), a low-level signal is applied from the weighted input terminal to another three capacitors corresponding to the unit capacitance C (the C and 2C capacitors in FIG. 6), and signals from the comparators 402 are applied to the seven remaining terminals. Therefore, upon reception of the outputs from the comparators 402, when the number of high-level signals is a majority, i.e., when four out of seven inputs are high-level signals, 4+3 (3=weight)=7 in 13 inputs as a whole, and a majority is determined. Thus, the majority arithmetic operation circuit block outputs a high-level signal.

Column S3 in Table 1 below shows the output values of the 13-input majority arithmetic operation circuit block in units of the numbers of high-level signals of inputs. The output signals are latched by the latch circuits 12 in response to pulses φLAT1 and φLAT2. For example, when four or more out of seven inputs are high-level signals, a high-level signal is applied to the weighted input terminal 501, and a low-level signal is applied to the weighted input terminals 502 and 503. Furthermore, when six or more out of seven input signals applied to the input terminals other than the weighted input terminals are high-level signals, the 13-input majority arithmetic operation circuit determines a majority as a whole, and outputs a high-level signal as the second arithmetic operation result. Therefore, in the second arithmetic operation, when four or more and five or more out of seven inputs are high-level signals, the circuit outputs a low-level signal since a majority is not determined. Similarly, by changing the signals to be applied to the weighted input terminals in correspondence with the polarity of the output signal and switching operations of switches 403, outputs shown in Table 1 can be obtained. With the above-mentioned arrangement, as shown in Table 1, conversion of the number of input signals which coincide with the correlation coefficients of a plurality of input signals into a 3-digit binary value can be realized by a very small-scale circuit and low consumption of power.

TABLE 1

| Input | S3 | S2 | S1 |
|---|---|---|---|
| 0/7 | 0 | 0 | 0 |
| 1/7 | 0 | 0 | 1 |
| 2/7 | 0 | 1 | 0 |
| 3/7 | 0 | 1 | 1 |
| 4/7 | 1 | 0 | 0 |
| 5/7 | 1 | 0 | 1 |
| 6/7 | 1 | 1 | 0 |
| 7/7 | 1 | 1 | 1 |

[Third Embodiment]

Figure 8:
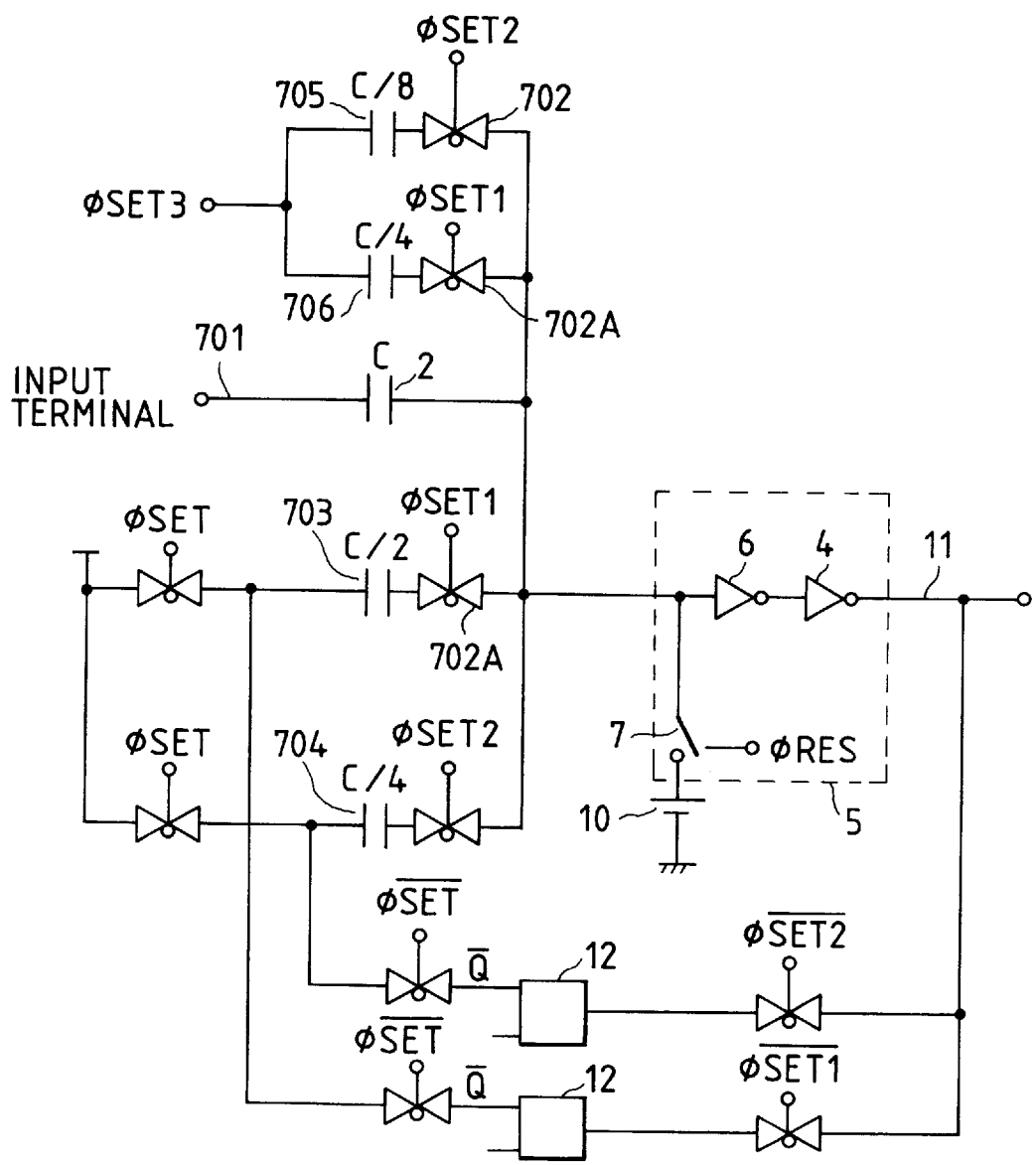

FIG. 8 is a schematic circuit diagram of a preferred embodiment in which the present invention is applied to a 3-bit analog-to-digital converter (to be referred to as an A/D converter hereinafter). Referring to FIG. 8, the A/D converter includes an analog signal input terminal 701, switches 702, latch circuits 12, a capacitor 703 having a capacitance value half that of a capacitor provided to the analog signal input terminal, and a capacitor 704 having a capacitance value ¼ that of the capacitor provided to the analog signal input terminal. The operation will be described below while taking as an example a case wherein a power supply of 5 V is used. First, the input terminal of a sense amplifier 5 is reset to 0 V. At this time, the signal input terminal 701 is at 0 V. When the analog signal input terminal 701 is changed from 0 V to an analog signal voltage, and the analog input signal becomes equal to or higher than about 2.5 V, the sense amplifier input potential in an arithmetic operation circuit block exceeds a logic inversion voltage (assumed to be 2.5 V in this case), thus outputting a high-level signal.

Column S3 in Table 2 below shows the output results. The arithmetic operation result is latched by the latch circuits 12 as soon as it is output. Switches 702A are enabled in response to a pulse φSET1. Then, one terminal of the capacitor 703 is reset to 5 V in response to a pulse φSET. At the same time, one terminal of a capacitor 706 is reset to 5 V in response to a pulse φSET3. The pulse φSET is turned off to input the signals from the latch circuits 12, and at the same time, one terminal of the capacitor 706 is set at 0 V in response to the pulse φSET3. At this time, the potential change at the input terminal of the sense amplifier is given by:

$$[C \times VA - (C/2) \times 5 - (C/4) \times 5]/(C + C/2 + C/4) \quad (2)$$

where VA is the analog input signal voltage.

As can be seen from this formula, a high-level signal is output when the analog signal voltage VA is equal to or higher than 3.75 V at the current timing; a low-level signal is output when the voltage VA is equal to or higher than 2.5 V and less than 3.75 V. Column S2 of Table 2 below shows the outputs results. Subsequently, a similar arithmetic operation is performed in response to the pulses φSET2, φSET, and φSET3. Column S1 of Table 2 below shows the output results. With the above arrangement, as shown in Table 2, an A/D converter for converting an analog signal voltage into a 3-bit digital signal, and outputting the digital signal can be realized by a very small-scale arrangement that allows a high operation speed and low consumption of power.

TABLE 2

| Analog Input Voltage | S3 | S2 | S1 |
| --- | --- | --- | --- |
| 0.0 ≦ VA < 0.625 | 0 | 0 | 0 |
| 0.625 ≦ VA < 1.25 | 0 | 0 | 1 |
| 1.25 ≦ VA < 1.875 | 0 | 1 | 0 |
| 1.875 ≦ VA < 2.5 | 0 | 1 | 1 |
| 2.5 ≦ VA < 3.125 | 1 | 0 | 0 |
| 3.125 ≦ VA < 3.75 | 1 | 0 | 1 |
| 3.75 ≦ VA < 4.375 | 1 | 1 | 0 |
| 4.375 ≦ VA < 5.0 | 1 | 1 | 1 |

In this embodiment, the 3-bit A/D converter has been described. However, the present invention is not limited to this, as a matter of course, and the number of bits can be easily increased. In this embodiment, a flash type A/D converter using capacitors has been exemplified. However, the present invention is not limited to this. For example, the present invention may be applied to an encoder circuit section of an A/D converter which performs A/D conversion in such a manner that comparators compare signals input to a resistor array and a reference signal, and an encoder encodes the comparison results, thus obtaining the same effects as described above. Furthermore, in this embodiment, the correlation operating device and the A/D converter have been exemplified. However, the present invention is not limited to these units. For example, the present invention may be applied to various other logic circuits such as a digital-to-analog converter, an adder, a subtracter, and the like, thus obtaining the same effects as described above. Especially, when the present invention is applied to a D/A converter, if the capacitance of the input terminal for receiving LSB data is represented by C, the capacitances need only be set to be twice as large as the immediately preceding value toward the most significant bit like 2C, 4C, 8C, . . . , thus realizing a binary D/A converter. In this case, the outputs from the commonly connected terminals of the capacitors can be received by a source floor amplifier.

As described above, in the circuit block in which the terminals on one side of the capacitor corresponding to multiple input terminals are commonly connected to the input of the sense amplifier, when the minimum one of capacitances connected to the multiple input terminals is represented by C, the total of the capacitances of the capacitor is an almost an odd multiple of C.

When a correlation operating device has no control input terminal, all the capacitances connected to the input terminals have a minimum value. On the other hand, when the correlation operating device has control input terminals, as has been described above in the above embodiment, the capacitances connected to the control input terminals are even multiples of C like 2C and 4C, and a total of the capacitances of these terminals and an odd number of input signal terminals is an almost odd multiple of the unit capacitance C. With this arrangement, comparison with a desired reference value can be clearly attained, thus improving arithmetic operation precision.

The correlation operating device has been exemplified. In the case of a binary D/A converter, if the signal input capacitance of the least significant bit (LSB) is represented by C, the capacitance of the next bit is 2C, that of the still next bit is 4C, and the like, i.e., the capacitance of each bit assumes a value twice as large as the immediately preceding bit, and a total of capacitances of multiple input terminals becomes exactly or substantially an odd multiple of C, thus realizing a high-precision D/A converter.

As for the A/D converter, the number of divisions for discriminating if the analog signal level is higher than or lower than ½ of a full range is set to be an odd number, i.e., 1, and the number of divisions for discriminating if the analog signal level is higher than or lower than ¼, ²⁄₄, ¾, or ⁴⁄₄ of the full range is also set to be an odd number, i.e., 3. Thus, the total of the capacitances connected to the multiple input terminals can be set to be exactly or substantially an odd multiple of the minimum capacitance value. Since this arrangement can attain a high-precision arithmetic operation, low consumption of power and high-speed arithmetic operations can be realized without arranging any unnecessary large capacitances.

[Fourth Embodiment]

Figure 9:
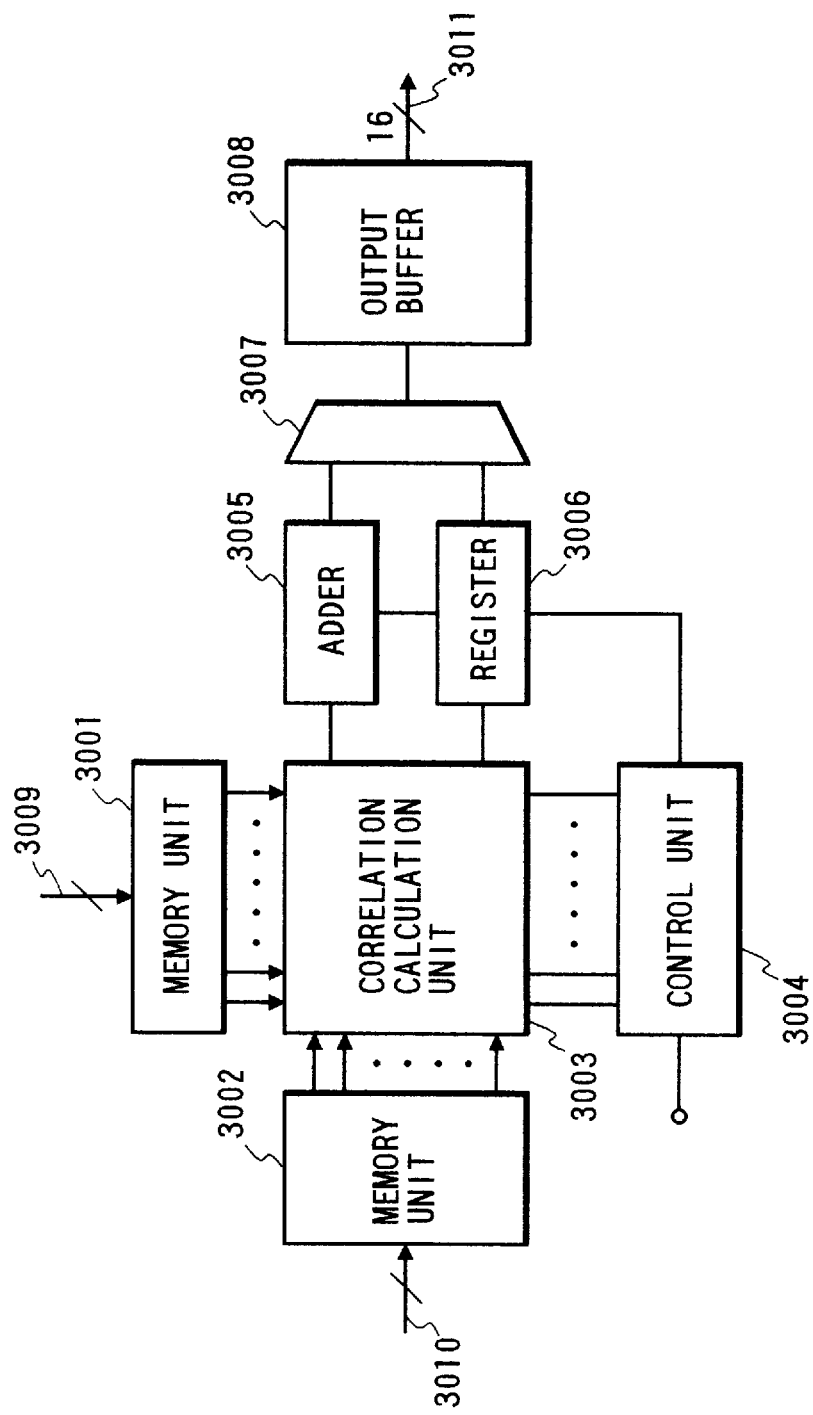
FIG. 9 is a block diagram for explaining the arrangement of the overall semiconductor device which utilizes the present invention.

FIG. 9 shows the fourth embodiment of the present invention. The fourth embodiment realizes a motion detection chip upon a combination of the semiconductor device of the present invention and the conventional circuit technique. Referring to FIG. 9, the apparatus includes memory units 3001 and 3002 for respectively storing reference data and comparison data, a correlation calculation unit 3003, a control unit 3004 for controlling the entire chip, an adder 3005 for adding the correlation results, a register 3006 for holding a minimum value of the sums from the adder 3005, a unit 3007 serving as a comparator and a unit for storing the address of the minimum value, and a unit 3008 serving as an output buffer and an output result storage unit. A terminal 3009 receives a reference data string, and a terminal 3010 receives a comparison data string to be compared with the reference data string.

The memory units 3001 and 3002 comprise, e.g., SRAMs, and are constituted by conventional CMOS circuits. Data supplied to the correlation operating unit 3003 can be processed by parallel processing since the unit 3003 comprises a correlation operating device of the present invention. For this reason, the unit 3003 can not only attain very high-speed processing, but also be constituted by a smaller number of elements, thus reducing the chip size and cost. The correlation calculation result is scored (evaluated) by the adder 3005, and is compared with the contents of the register 3006 which stores the maximum correlation calculation result (minimum sum) before the current correlation calculation by the unit 3007. If the current calculation result is smaller than the previous minimum value, the current result is newly stored in the register 3006; if the previous result is smaller than the current result, the previous result is maintained.

With this operation, the maximum correlation arithmetic operation result is always stored in the register 3006, and upon completion of calculations of all the data strings, the final correlation result is output from a terminal 3011. The control unit 3004, the adder 3005, the register 3006, and the units 3007 and 3008 are constituted by conventional CMOS circuit in this apparatus. In particular, when the adder 3005 adopts the circuit arrangement of the present invention, parallel additions can be realized, thus realizing high-speed processing. As has been described above, not only are high-speed processing and low cost realized but also the consumption current can be reduced since arithmetic operations are executed on the basis of capacitances, thus realizing low consumption of power. For this reason, the present invention is suitably applied to portable equipment such as an 8-mm VTR camera or the like.

[Fifth Embodiment]

Figure 10A:
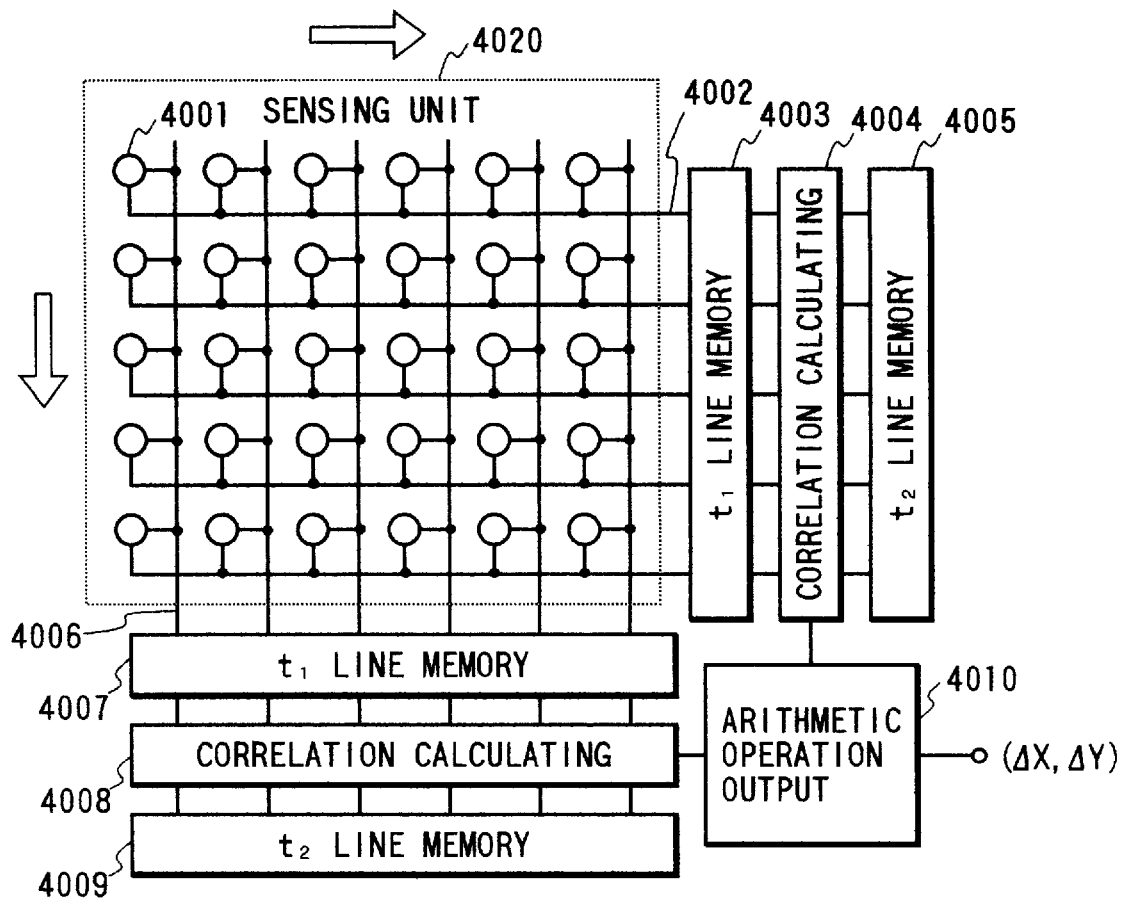
FIG. 10A is a schematic diagram for explaining a signal processing system which utilizes the semiconductor device of the present invention.
Figure 10B:
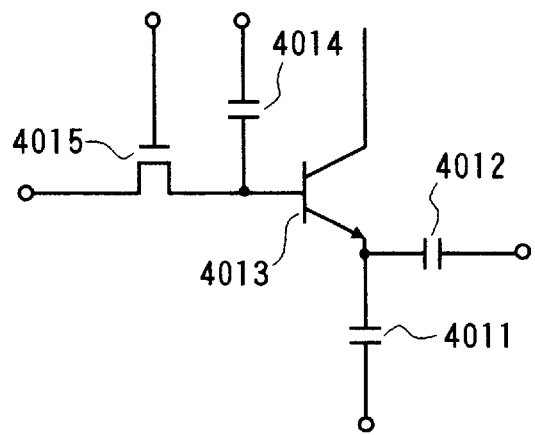
FIG. 10B is an equivalent circuit diagram for explaining the arrangement of a pixel portion.
Figure 10C:
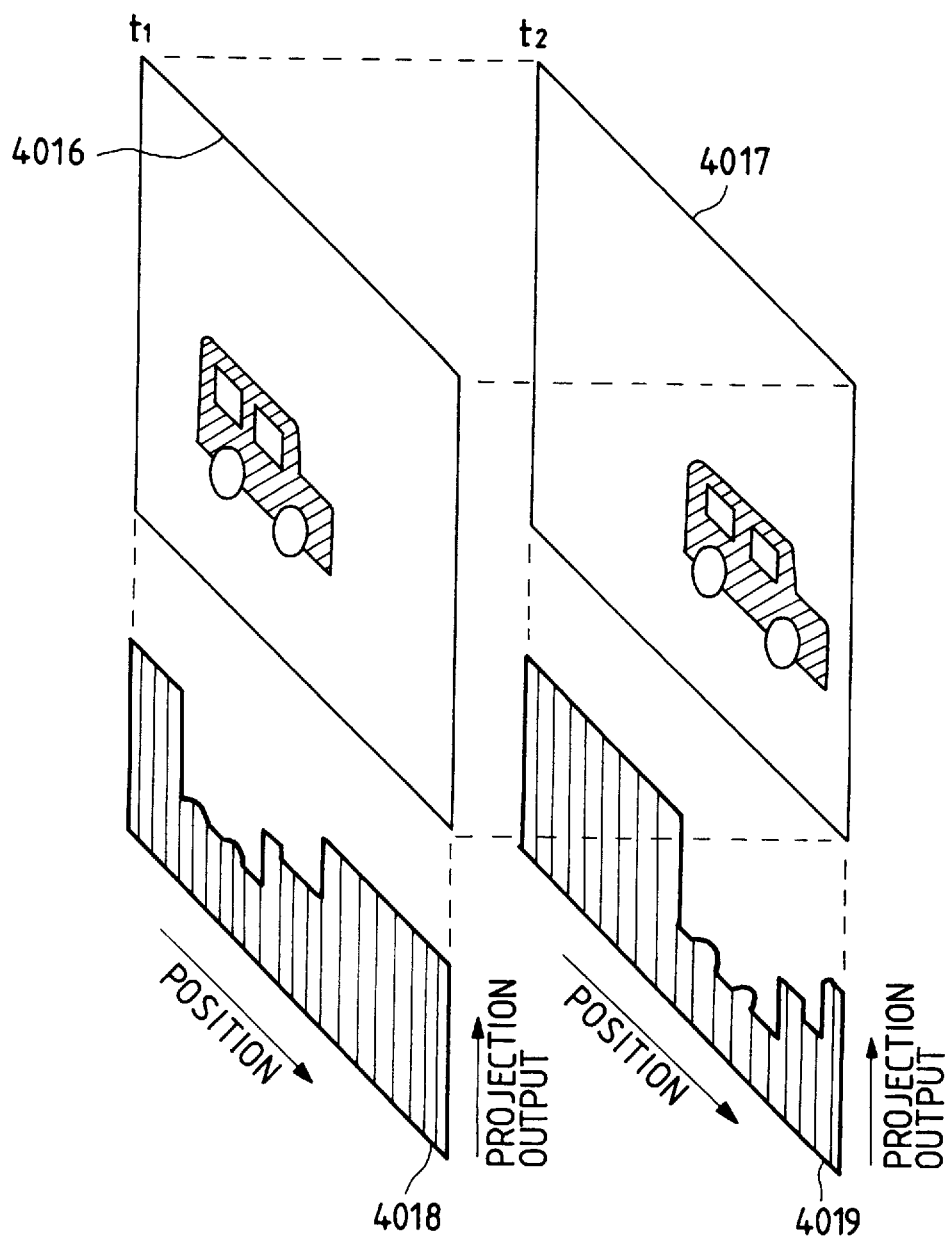
FIG. 10C is an explanatory view for explaining the arithmetic operation contents.

FIGS. 10A to 10C show the fifth embodiment of the present invention. The fifth embodiment presents a chip (high-speed image processing apparatus) which performs high-speed image processing before image data is read out upon combination of the semiconductor device of the present invention and an optical sensor (solid-state image pickup element). FIG. 10A shows the overall arrangement, FIG. 10B shows the arrangement of a pixel portion, and FIG. 10C shows the arithmetic operation contents.

Referring to FIGS. 10A and 10B, the chip includes light-receiving portions 4001, memory units 4003, 4005, 4007, and 4009, correlation calculating units 4004 and 4008, an arithmetic operation output unit 4010, capacitor 4011 and 4012 for respectively connecting optical signal output terminals and output bus lines 4002 and 4006, bipolar transistors 4013, capacitor 4014 connected to the base regions of the bipolar transistors, and switch transistors 4015. Image data input to an image data sensing unit 4020 is photoelectrically converted by the base region of each bipolar transistor 4013.

An output corresponding to the photoelectrically converted photocarriers is read out to the emitter of the bipolar transistor 4013, and raises the output bus line potentials in correspondence with the signal via the capacitor 4011 and 4012. With the above-mentioned operation, the sum of the outputs from the pixels in the column direction is read out to the memory unit 4007, and the sum of the outputs from the pixels in the row direction is read out to the memory unit 4003. In this case, if a region where the base potential of the bipolar transistor is raised via the capacitor 4014 of each pixel portion is selected using, e.g., a decoder (not shown), the sums in the X- and Y-directions of an arbitrary region on the sensing unit 4020 can be output.

For example, as shown in FIG. 10C, when an image 4016 is input at time $t_1$, and an image 4017 is input at time $t_2$, output results 4018 and 4019 obtained by respectively adding these images in the Y-direction are obtained, and these data are respectively stored in the memory units 4007 and 4009 shown in FIG. 10A. As can be seen from the output results 4018 and 4019 shown in FIG. 10C, the data of the two images shift in correspondence with the motion of the image. Thus, when the correlation operating unit 4008 calculates the shift amount, the motion of an object on the two-dimensional plane can be detected by a very simple method. Note that data from the sensing unit 4020 can be easily selectively stored in the line memory units 4003 and 4005.

The correlation calculating units 4004 and 4008 shown in FIG. 10A can comprise the correlation operating circuit of the present invention. Each of these units has a smaller number of elements than the conventional circuit, and, in particular, can be at the sensor pixel pitch. This arrangement performs arithmetic operations on the basis of analog signals output from the sensor. However, when the A/D converter of the present invention is arranged between each memory unit and the output bus line, a digital correlation arithmetic operation can be realized, needless to say. The sensor of the present invention comprises a bipolar transistor. However, the present invention is also effective for a MOS transistor or only a photodiode without arranging any amplification transistor. Furthermore, the above-mentioned arrangement performs a correlation arithmetic operation between data strings at different times. Alternatively, when X- and Y-projection results of a plurality of pattern data to be recognized are stored in one memory, pattern recognition can also be realized.

As described above, when the pixel input unit and the circuit of the present invention are combined, the following effects are expected.

(1) Since data which are parallelly and simultaneously read out from the sensor are subjected to parallel processing unlike in the conventional processing for serially reading out data from the sensor, high-speed motion detection and pattern recognition processing can be realized.

(2) Since image processing can be realized by one sensor chip without increasing the size of peripheral circuits, the following high-grade function products can be realized with low cost: control for turning the TV screen toward the user direction, control for turning the wind direction of an air conditioner toward the user, tracing control of an 8-mm VTR camera, label recognition in a factory, manufacture of a reception robot that can automatically recognize a person, and manufacture of an inter-vehicle distance controller for a vehicle.

The combination of the image input unit and the circuit of the present invention has been described. The present invention is effective not only for image data but also for, e.g., recognition processing of audio data.

As described above, according to the present invention, capacitors are connected to multiple input terminals via the switch means, the terminals at one side of the capacitors are commonly connected to the sense amplifier, and the output from the sense amplifier is connected to at least one of the multiple input terminals. With this arrangement, various effects such as a small circuit scale, a high operation speed, and low consumption of power can be obtained.

Upon reduction of the circuit scale, a small chip size can be realized, and the yield can be improved. As a result, cost can be reduced.

Note that the present invention is not limited to the above embodiments and description, and appropriate modifications may be made within the scope of the invention. Also, the arrangements of the latch circuit and the sense amplifier are not limited to the above-mentioned ones, and may be replaced by other arrangements.

What is claimed is:

1. A semiconductor device comprising:

a plurality of input terminals separated into at least two groups;

a plurality of capacitors, one terminal of each of which is electrically connected to a corresponding one of said input terminals via a switch; and a sense amplifier, an input portion of which is commonly connected to remaining terminals of said capacitors, wherein an output from said sense amplifier is connected to at least one of said input terminals, and the input terminal or terminals to which the output from said sense amplifier is inputted belong to only one of the at least two groups.

2. A device according to claim 1, wherein the output from said sense amplifier is connected to at least one of said input terminals via a latch circuit.

3. A semiconductor circuit having a plurality of semiconductor devices of claim 1, wherein an output from said sense amplifier is connected through a latch circuit to at least one of said input terminals.

4. A device according to claim 1, wherein, when a minimum capacitance of said capacitors corresponding to said input terminals is represented by C, a total of capacitances of the commonly connected capacitors is equal to a sum of capacitances of the plural capacitors or substantially an odd multiple value of the minimum capacitance C.

5. An operating device for performing a correlation arithmetic operation using a semiconductor device of claim 1.

6. A signal converter which is an A/D converter including a semiconductor device of claim 1, and inputs an analog signal to said semiconductor device and outputs a digital signal corresponding to the analog signal.

7. A signal converter which is a D/A converter including a semiconductor device of claim 1, and inputs a digital signal to said semiconductor device and outputs an analog signal corresponding to the digital signal.

8. A device according to claim 1, further comprising an additional capacitor electrically connected commonly to said plural capacitors at an input side of said sense amplifier.

9. A device according to claim 8, further comprising a switch provided at an input section side of said sense amplifier, for resetting said plural capacitors and said additional capacitor.

10. A device according to claim 1, further comprising a switch connected to an input side of said sense amplifier for resetting said plural capacitors.

11. A device according to claim 1, wherein a group to which said sense amplifier is connected has plural capacitors.

12. A device according to claim 11, wherein said plural capacitors have capacitors whose capacitances are different from each other.

13. A signal processing system comprising:

a correlation calculating circuit using a semiconductor device comprising plural input terminals separated into at least two groups;

plural capacitors one terminal of each of which is respectively connected electrically through a respective switch to a respective one of said input terminals; and a sense amplifier having an input section connected commonly to the other terminals of said capacitors, wherein an output from said sense amplifier is connected to at least one group of said input terminals, and the input terminal or terminals to which the output from said sense amplifier is inputted belong to only one of the at least two groups.

14. A signal processing system according to claim 13, further comprising an image input device for inputting an image signal.

15. A signal processing system according to claim 13, further comprising a storage device for storing information.

16. A signal processing system comprising a signal converter, i.e., A/D converter for inputting an analog signal having a semiconductor device comprising plural input terminals; plural capacitors one terminal of each of which is electrically connected through a respective switch correspondingly to one of said input terminals; a sense amplifier having an input section connected commonly to the other terminals of said capacitors; an additional capacitor, provided at an input section side of said sense amplifier, electrically connected commonly to said plural capacitors; and a reset switch connected to an input side of said sense amplifier for resetting said plural capacitors and said additional capacitor, wherein an output from said sense amplifier is connected at least one of said input terminals, and the input terminal or terminals to which the output from said sense amplifier is inputted belong to only one of the at least two groups.

17. A signal processing system comprising a signal converter, i.e., D/A converter for inputting a digital signal and outputting an analog signal corresponding to the digital signal has a semiconductor device comprising plural input terminals, plural capacitors one terminal of which each of is electrically connected through a respective switch to a respective one of said input terminals; a sense amplifier having an input section connected commonly to the other terminals of said plural capacitors; and a rest switch connected to an input section side of said sense amplifier, wherein an output from said sense amplifier is connected to at least one of said input terminals, and the input terminal or terminals to which the output from said sense amplifier is inputted belong to only one of the at least two groups.

* * * * *

UNITED STATES PATENT AND TRADEMARK OFFICE
CERTIFICATE OF CORRECTION

PATENT NO. : 5,841,685

DATED : November 24, 1998

INVENTOR(S): TETSUNOBU KOCHI

It is certified that error appears in the above-identified patent and that said Letters Patent is hereby corrected as shown below:

COLUMN 1

Line 23, "times of" should read --times--.
    Line 37, "movement" should read --movement)--.
    Line 47, "process" should read --poses--.
    Line 52, "scale are posed." should read --scale.--.

COLUMN 3

Line 42, "(RES" should read --ØRES--.

COLUMN 5

Line 27, "pulse T," should read --pulse ØT,--.

COLUMN 7

Line 20, "outputs" should read --output--.

COLUMN 8

Line 7, "an almost" should read --almost--.
    Line 16, "an almost" should read --almost an--.

UNITED STATES PATENT AND TRADEMARK OFFICE
CERTIFICATE OF CORRECTION

PATENT NO. : 5,841,685

DATED : November 24, 1998

INVENTOR(S) : TETSUNOBU KOCHI

It is certified that error appears in the above-identified patent and that said Letters Patent is hereby corrected as shown below:

<u>COLUMN 12</u>

```
Line 31 "connected" should read --connected to--.
Line 38, "has" should read --, having--.
Line 39, "which each of" should read --each of which--.
```

Signed and Sealed this

Twenty-first Day of September, 1999

Attest:

Q. TODD DICKINSON

*Attesting Officer*    *Acting Commissioner of Patents and Trademarks*